(12) United States Patent
DeVolk

(10) Patent No.: US 7,414,461 B2
(45) Date of Patent: Aug. 19, 2008

(54) LINEARIZATION TECHNIQUE FOR CURRENT MODE FILTERS

(75) Inventor: Burton DeVolk, Colorado Springs, CO (US)

(73) Assignee: Fairchild Semiconductor Corporation, South Portland, ME (US)

(*) Notice: Subject to any disclaimer, the term of this patent is extended or adjusted under 35 U.S.C. 154(b) by 59 days.

(21) Appl. No.: 11/534,716

(22) Filed: Sep. 25, 2006

(65) Prior Publication Data

US 2008/0074177 A1 Mar. 27, 2008

(51) Int. Cl.
*H03K 5/00* (2006.01)
(52) U.S. Cl. .................. 327/552; 327/558; 327/344
(58) Field of Classification Search ......... 327/551–559, 327/336, 344
See application file for complete search history.

(56) References Cited

U.S. PATENT DOCUMENTS

| | | | | |
|---|---|---|---|---|
| 4,340,868 A | * | 7/1982 | Pace | 330/294 |
| 4,843,343 A | * | 6/1989 | Pace | 330/257 |
| 5,572,162 A | * | 11/1996 | Cotreau | 327/552 |
| 6,433,626 B1 | * | 8/2002 | Guimaraes | 327/552 |
| 6,720,817 B2 | * | 4/2004 | El-Gamal | 327/350 |

OTHER PUBLICATIONS

Smith, Sterling L. et al., Low Voltage Integrators For High-Frequency CMOS Filters Using Current Mode Techniques, IEEE Transactions On Circuits And Systems—II: Analog And Digital Signal Processing, Jan. 1996, vol. 43, No. 1.
Aboushady, H. et al., Systematic Design Of High-Linearity Current-Mode Integrators For Low-Power Continuous-Time ΣΔ Modulators, IEEE International Conference On Electronic Circuits And Systems, ICECS'01, Sep. 2001, Malta.

* cited by examiner

*Primary Examiner*—Dinh T. Le
(74) *Attorney, Agent, or Firm*—Cesari and McKenna, LLP; Edwin H. Paul, Esq.

(57) ABSTRACT

A circuit is disclosed that compensates for the non-linearity of a current mode real pole producing circuit used to generate poles and zeros in complex filter circuits. The non-linearity of the prior art is compensated by driving one end of the primary pole producing capacitor with a signal derived from the drain current and fed back so as to counteract the non-linearity factors.

20 Claims, 2 Drawing Sheets

LINEARIZATION TECHNIQUE FOR CURRENT MODE FILTERS

BACKGROUND OF THE INVENTION

1. Field of the Invention

The present invention relates to current mode circuitry employed for creation of poles and zeros that are combined with feedback to create complex filter functions. More particularly, the present invention relates to a cell structure having a current mirror and a capacitor to create a single real pole with which virtually any filter function can be realized using scale factors, summers, feedback and feedforward circuits. The term "real" as used herein references the "real" axis in the complex plane.

2. Background Information

Current mode signal processing is common due to its advantages in low voltage applications and where high speed and/or small size are important compared to voltage mode circuitry. Diode connected devices exhibit such characteristics in current mirror configurations. Diode connected circuits also exhibit few internal nodes with parasitic poles thus increasing operating frequencies.

Diode connected devices compared to voltage mode circuits, however, generally have higher noise and distortion for a given device size and bias current (power dissipation).

FIG. 1 illustrates known MOS current mirror operation. The PMOS devices M5 to M8 provide bias current while NMOS devices M1 to M4 comprise the current mirror. As known to those skilled in the art, the cascade configuration illustrated by FIG. 1 generally reduces the gain error implicit when the output of a first current source drives the input of a second. If g1 is the output conductance of the first and g2 the input conductance of the second, a gain error of g1/(g1+g2) is introduced. Using the cascode g1 is made small reducing this error.

The drain current of M1 is $I_{B1}+id1$, where $I_{B1}$ is the output from the PMOS current source, M5 and M7. The time varying component of the drain current through M1, also referred to as the small signal, is id1, which equals i(in). Also, the small signal current through M2 is id2 which equals −i(out) (as illustrated). The current id2 is a current mirror of id1, and the gain A of a current mirror is normally the width ratio of the MOS devices in the output leg compared to that in the input leg, with corresponding lengths being equal. So considering the mirrors forming Ib1 and Ib2, A is equal to the width of M8 and M6 compared to the widths of M7 and M5, with equal lengths. In practical applications, the gain A is used to provide gain, attenuations and scale factors for current used in feedback or feed forward applications. Thus id2=(A)id1, and i(out)=−(A)i(in), and with A=1, i(out)=−i(in). In the following discussions, A=1, but other values may be used to advantage.

It is well known that the basic current mirror is very linear of a wide signal dynamic range relative to its bias current. If M1 and M2, of FIG. 1, have equal gate to source and drain to source voltages, Vgs and Vds, respectively, and the substrates are biased to eliminate body effects, the mirrors will demonstrate a very linear current transfer ratio. This also is a benefit of the cascade structure. In practical applications, it is possible to have up to 80 db (four decades, or 10,000/1) THD (Total Harmonic Distortion) where the small signal current may run up to 70% of the bias current. Careful design will require that the drain to source voltage of the mirrors is significantly above the Veff of the MOS device, where Veff=Vgs−$V_T$. $V_T$ is the threshold voltage of the device.

Using the basic current mirror of FIG. 1, FIG. 2A illustrates adding a capacitor, C, to realize a single real pole circuit. FIG. 2B is a small signal equivalent circuit representation of the circuit of FIG. 2A. FIG. 2A is a single ended circuit where the capacitor C provides a single pole structure. M1 is a diode connected MOS with the cascode M3 structure that may be used to set a DC level. M2 is a current mirror of M1 and provides an output current i(o) via the drain of the cascode M4.

The prior art circuits of FIGS. 2A and B are more fully described in a paper by Sterling L. Smith and Edgar Sanchez-Sinencio, entitle "Low voltage integrators for High-Frequency CMOS Filters Using Current Mode Techniques", published in IEEE Transactions on Circuits and Systems—II: Analog and Digital signal Processing, Vol. 43, No. 1, January 1996. This paper is hereby incorporated herein by reference. Please note that this paper and the present invention describe practical embodiments using differential inputs and outputs, but the present invention will find advantageous application as a single circuit. Obviously, differential applications double the physical size of the circuitry and the power dissipated, so single ended use is preferred in some applications. The following descriptions of single ended circuits are directly applicable to differential circuits by simple replicating the single ended circuits.

Poles and zeros are well known in the electronic arts and a basic working understanding of how they operate follows. Typically poles and zero are defined with respect to transfer functions (out/in) in the complex s or LaPlacian plane. Transient responses are included in the s plane whereas in the jω plane, that is often used, only the gain/phase characteristics of a transfer function are illustrated. A series low pass RC (resistor in series with a capacitor), with the voltage signal taken across the capacitor, and an input voltage signal coupled to the distal side of the resistor from the capacitor will demonstrate a one pole voltage gain/frequency transfer function.

Many papers and text exist describing such poles and zeros and those skilled in the art will understand their use as described in the present invention.

As mentioned above, the more practical circuit of FIG. 1B is described below in more detail. A time varying current signal i(in) is input to the capacitor C and a time varying signal i(o) is output from the drain of M4. This circuit represents the one pole fundamental cell mentioned above. This circuit is incorporated into feedback/feedforward designs to create complex poles and zeros pairs useful in complex filter functions.

By inspection of FIG. 2B, $$i(in)=id1+ic; \text{ and} \qquad \text{Eq. 1}$$

$$i(out)=-id2=-id1. \qquad \text{Eq. 2}$$

The small signal voltage across the capacitor of FIG. 2B is (id1/gm), and so the current ic through the capacitor is (id1/gm)Cs. So, from Eq. 1, i(in)=id1+(id1/gm)Cs=id1(1+Cs/gm). Or, id1=i(in)/(1+Cs/gm). Substituting this into Eq. 2, we have:

id1=−i(out)=i(in)/(1+Cs/gm), or the transfer function of the output divided by the input yields:

$$i(out)/i(in)=-1/(1+Cs/gm)=-(gm/C)/(s+gm/C). \qquad \text{Eq. 3}$$

By inspection there is a single real pole in Eq. 3 at s=−gm/C. The dimensions for s are radian/sec.

Distortion

Since the input signal current divides between the capacitor and the diode connected MOS device, and the capacitor voltage is the gate to source voltage Vgs of M1 in FIG. 2A, which introduces the major distortion factor. Generally, for a MOS device the Vgs can be represented by the threshold voltage VT plus the square root of the drain current divided by a constant, B. The constant B equal u(Cox)W/2L, where Cox is a capacitor factor of the oxide that forms the dielectric, u is a mobility factor and W is the effective channel width and L the length. Considering on the small signal of time varying portion of the Vc=Vgs=Veff=(id/B)½.

Thus, i(in)=ic+id1, where, i(c)=C(dVeff/dt)=C(d(id1/B)½/dt). Carrying out the operations, we have:

$$i(in) = id1(id1)^{1/2} + C/2(B)^{1/2} \quad \text{Eq. 4}$$

The conversion from i(in) to i(out) involves, first a conversion of i(in) to id1, and then from id1 to id2 and from id2 to i(out). With A=1, and other conditions described above, in on embodiment, i(out)=−id1. From Eq. 4 the relationship of i(in) to id1 is non-linear, so the relationship from i(in) to i(out) is non-linear.

It is an objective of the present invention to reduce this non-linearity.

The present invention improves linearity of the current prior art circuits. By improving linearity, the present invention advantageously improves noise for a given distortion level. Moreover, the present invention improves high frequency performance by using smaller devices and therefore lower parasitic capacitors, lower bias currents (and thus lower power dissipation) and use of less chip area and thus lower cost.

SUMMARY OF THE INVENTION

The present invention addresses the limitation of the prior art with a current mode circuit with a capacitor for creating a single real pole. The input current signal is applied to one end of the capacitor and a voltage is derived and applied to the distal end of the capacitor. The derived voltage is arranged to compensate for the inherent non-linearity of the prior art.

The present invention also provides advantages of a smaller device size and lower power dissipation at a given low voltage and high frequency operation compared to known current mode circuitry.

In current mode circuitry used to create real poles and zeros in active filters, as described herein, input current signal divides between a capacitor and an active device's gm (transconductance), as illustrated in FIG. 2A. Since the gm portion is non-linear with respect to the control voltage for the active device and that control voltage is across the capacitor, the active device introduces distortion into the signal that travels through the active device. The present invention provides a compensating signal to one side of the capacitor that linearizes the current through and the voltage across the capacitor, and thus the output current.

The present invention improves the linear response by placing a linearizing element in series with the capacitor. In a preferred embodiment, a common source amplifier drives one side of the capacitor with a voltage gain that magnifies the capacitors apparent value, the Miller effect. The current through the common source amplifier is a mirror of the non-linear current element through the active device. This non-linear mirror current is applied through a resistor (a linear device) and placed in series with the capacitor to introduce a linear element to the voltage across the capacitor.

The linearizing of the current mode filter circuitry may be accomplished by many circuit designs, but such alternatives to the preferred embodiments described herein and known to those skilled in the art are within the scope of the present invention.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 3A:
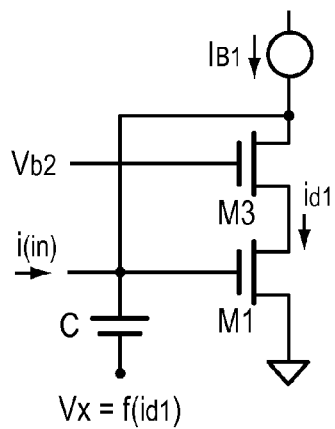
FIG. 3A is a schematic illustrating the invention.
Figure 3B:
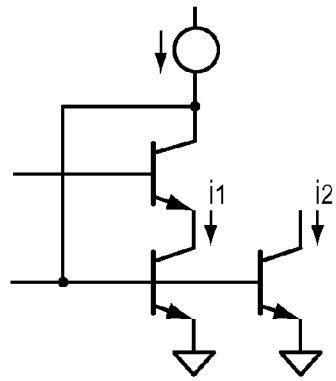
FIG. 3B is a schematic of diode connected bipolar current mirror.
Figure 3C:
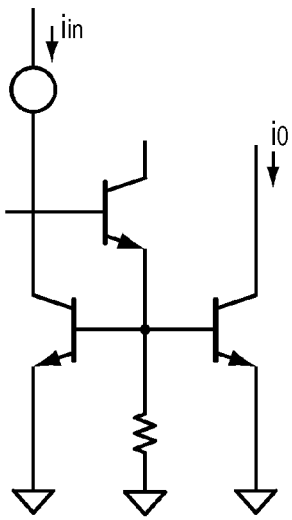
FIG. 3C is another bipolar current mirror.

FIG. 3A is a simplified schematic of a preferred embodiment illustrating the present invention. Here, a voltage Vx is developed from id1 and applied to the end of the capacitor. The implementation is designed so that the voltage across the capacitor Vc=Veff−Vx, and circuit design that produces—Vx which acts to compensate for the non-linear terms found in Veff. FIG. 3B represents a diode connected bipolar cascade set of transistors and a current mirror, where i2 is a mirror of i1. In FIG. 3C the transistor T2 helps to reduce errors attributable to base currents, as is known to those skilled in the art. MOS circuits are used for the following discussion, but bipolar or hybrids thereof may be used to advantage.

Figure 4:
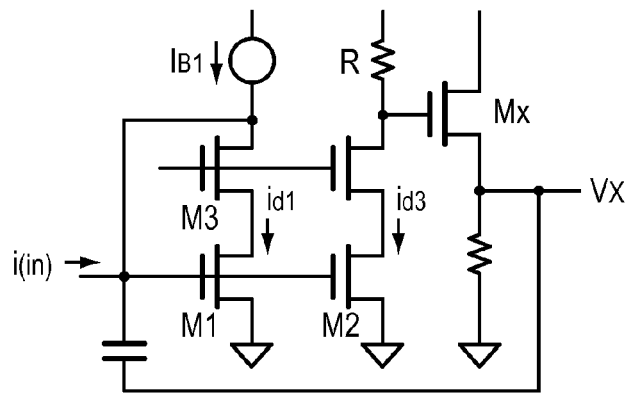
FIG. 4 is a more detailed schematic of that in FIG. 3.

FIG. 4 is a preferred embodiment circuit to produce Vx. Here the current mirror is designed for id3=id1, and the voltage drop across R is the linear function (R)id1. The source follower Mx drives the linear signal Vx back to the capacitor C.

In this instance the time varying part of Vc becomes:

Vc=Veff−(−(R)id1)=(id1/B)½+(R)id1. From inspection, Vc is more linear by the inclusion of (R)id1, and becomes increasingly linear as this term grows.

In practical applications, the technique shown in FIG. 4 has reduced harmonic distortion by 12 to 20 db over the prior art circuit.

Figure 5:
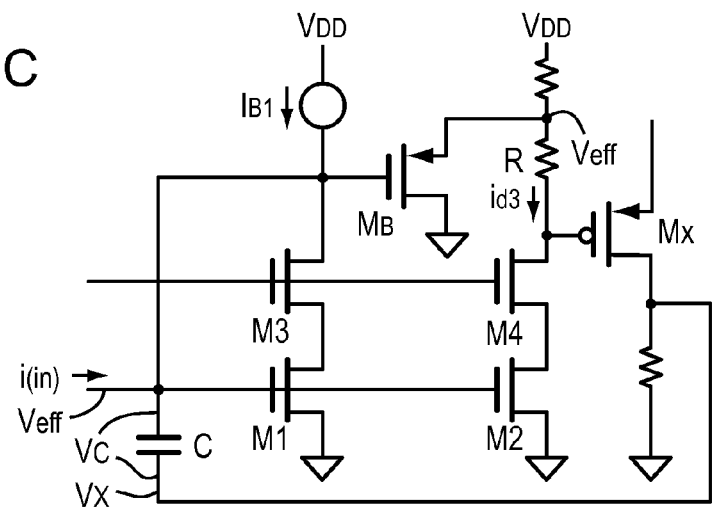
FIG. 5 is a schematic of another embodiment of the invention.

FIG. 5 is another technique for linearizing the voltage drop across the capacitor. FIG. 5 bootstraps out the Veff term by applying the time varying part of Vgs to the top of the resistor R. In detail, the following discusses the time varying voltage, Vc, across the capacitor C in FIG. 5. Veff at the gate of M1, appears at the source of the PMOS, Mb. There is a voltage drop across R of (R)id3, or (R)id1, since id3 is a mirror (gain=1) of id1. Thus the source voltage of the source follower, Mx, equals Veff−(R)id1. By inspection the voltage Vc across the capacitor C is:

Vc=Veff−(Veff−(R)id1)=(R)id1. The non-linear portion of Veff is boot-strapped out of the equation for the voltage across the capacitor.

FIGS. 4 and 5 include another advantage in that the capacitor C is, in effect, a Miller capacitor. The time varying voltage signal at the gate of M1 is amplified through the actions of M2. That signal is carried through the source follower Mx to be part of Vx along with the (R)id3 signal. Gains of 2 to 5 may be found in practical applications that act to increase the effective value of C, or advantageously reduce its size (and therefore the chip area) for the same pole frequency.

The linearization techniques of the present invention provide a larger signal swing, or dynamic range, with respect to the bias current for a given distortion specification. The larger signal swing per unit bias at the same distortion allows a lower bias current to be used. This advantageously affects signal to noise ratios, dissipates less power, at the same current densities and the same active device gm's. Ratios of peak signal current to bias may be to 0.7 or more with less distortion compared to prior art circuits. Of course, higher ratios will increase distortion.

Noise

It should be noted that the present invention is effectively noiseless in that other noise sources typically dominate so the incremental noise of the present invention is insignificant.

Figure 1:
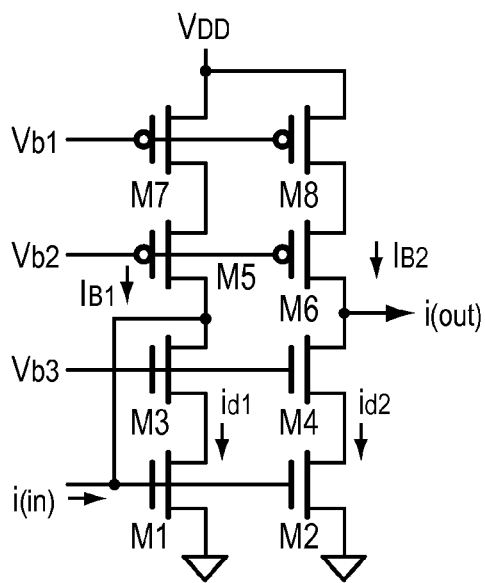
FIG. 1 is a schematic of prior art current mode cascade mirror circuits.
Figure 2A:
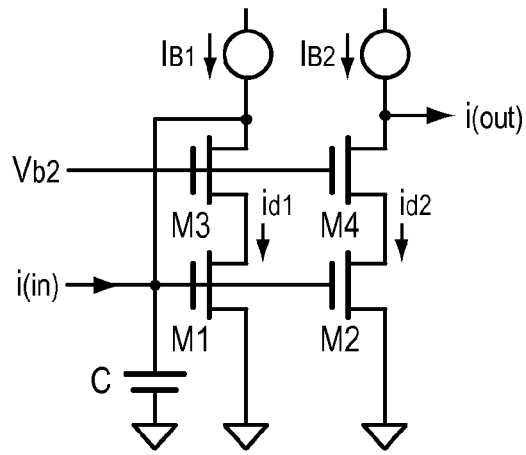
FIG. 2A is a schematic of a prior art one real pole circuit using the mirror circuit of FIG. 1.
Figure 2B:
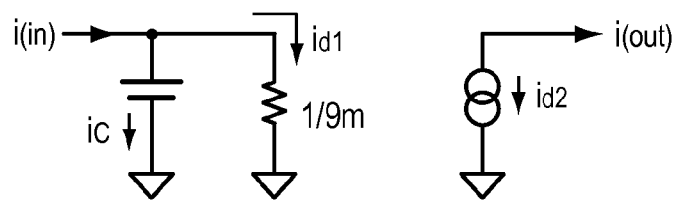
FIG. 2B is a schematic illustrating an equivalent circuit model of the schematic of FIG. 2A.

With respect to FIG. 1, the output noise current i(out)n is the root mean square of the both bias current noise and both mirror transistors. That is:

$$i(\text{out})n = (i^2 d1n + i^2 dn2 + i^2 b1n + i^2 b2n)_{1/2}.$$

Each noise source is related to the gm of the device, MOS or bipolar active device or passive resistor. It is advantageous to reduce the gm's.

In practical applications the bias current will not generally be available for reducing gm's. For bipolar circuits, an emitter degeneration resistor will reduce the effective gm of the e transistor, and thus the noise. For MOS circuits, the channel width to length ratio can be used. Generally, shorter channels demonstrate increased noise.

The present embodiment provides the pole at gm/C, so that reducing the gm and the C will reduce circuit noise and chip area. Reducing gm while keeping the bias current constant will require an increase in voltage, but low supply voltages and emitter resistors limit this approach. Lowering the width of MOS devices (effectively increasing the channel length) can be used to reduce noise, but device matching limits this approach.

The SNR (signal to noise ratio) can be increased by increasing the bias current and the signal current peak but keeping the ratio constant. Distortion will not increase, but the SNR will increase, since the signal will increase linearly with the bias current, but the noise by the square root of the bias current.

An $8^{th}$ order Chebychev filter was designed and simulated. It had a 60 db SNR, and 45 db THD at 40 MHz. The design approach was to use the prior art design of FIG. A to simulate a ratio of the signal current to the bias current to achieve the THD and then the area (width/length) of the MOS device was scaled until the SNR was achieved. Then, the design approach of FIG. 4 resulted in the bias current and area of the MOS devices being reduced by a factor of four while keeping the peak signal swing the same. The resulting circuit had the same bandwidth, slightly better distortion and noise with one fourth the area of the MOS devices and about one third the power of the prior art design.

Others skilled in the art may design other circuits that provide a linearization of the voltage across the capacitor to compensate for the square law non-linearity of the active devices. As mentioned above, for a MOS, the nonlinearity is due to the square law Vgs versus i(d), and in bipolar it is the log function of a base/emitter versus collector current. Please note however, that for short channel MOS devices, say below one micron, the relationship is non-linear, but does not follow a square law.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A current mode circuit for creating a single real pole, the circuit comprising:
    a first terminal for accepting an input current;
    a capacitor with one end coupled to the first terminal and a second end;
    an active device with a control node, and second and third nodes, the control node coupled to the first terminal, wherein the active device provides a first current at the third node, whose value is controlled by a control voltage between the control node and the second node;
    a current path from the input terminal to the third node, wherein the input current divides between the capacitor and the active device third node;
    a first circuit arranged to provide a mirror of the first current;
    a passive linear device arranged to accept the mirror of the first current and provide a voltage signal; and
    a coupling of the voltage signal in series with the second end of the capacitor.

2. The current mode circuit of claim 1 wherein the active device is a MOSFET device, the control voltage is the gate to source voltage, the first current is the drain current, and the relationship of the drain current is non-linear with respect to the gate to source voltage.

3. The current mode circuit of claim 1 wherein the active device is a bipolar transistor, the control node is the base, the second node is the emitter and the third node is the collector.

4. The circuit of claim 1 wherein the passive linear device is a resistor.

5. The current mode circuit of claim 1 wherein the first circuit is a common source or common emitter amplifier.

6. The current mode circuit of claim 5 wherein the common source or common emitter amplifier has an output that couples to the second end of the capacitor.

7. The current mode circuit of claim 6 wherein the common source or emitter amplifier provides a voltage gain that multiplies the value of the capacitor by the voltage gain.

8. A current mode circuit for creating a single real pole, the circuit comprising:
    means for accepting an input current at a first terminal;
    a capacitor with one end coupled to the first terminal and a second end;
    an active device with a control node, and second and third nodes, the control node coupled to the first terminal, wherein the active device provides a first current at the third node, whose value is controlled by a control voltage between the control node and the second node;
    means for establishing a current path from the input terminal to the third node, wherein the input current divides between the capacitor and the active device third node;
    means for outputting a mirror current of the first current;
    means for accepting the mirror current of the first current and means for providing a linear voltage signal; and
    means for connecting the linear voltage signal in series with the capacitor.

9. The current mode circuit of claim 8 wherein the active device is a MOSFET device, the control voltage is the gate to source voltage, the first current is the drain current, and the relationship of the drain current is a non-linear function with respect to the gate to source voltage.

10. The current mode circuit of claim 8 wherein the active device is a bipolar transistor, the control node is the base, the second node is the emitter and the third node is the collector.

11. The circuit of claim 8 wherein the means for providing a linear voltage signal is a resistor.

12. The current mode circuit of claim 8 wherein the means for providing a mirror current is a common source or common emitter amplifier with an output that couples to the second end of the capacitor.

13. The current mode circuit of claim 8 wherein the means for providing a mirror current also provides a voltage gain that multiplies the effective value of the capacitor by the voltage gain.

14. A method for creating a single real pole, the method comprising the steps of:
 accepting an input current at a first terminal;
 splitting the input current between a capacitor and a second path;
 accumulating charge from the input current on the capacitor, the capacitor having a first end coupled to the first terminal and a second end;
 controlling the part of the input current traveling via the second path by a voltage control node and a second node of an active device;
 developing a mirror current of the current in the second path;
 sending the mirror current through a linear device to provide a linear voltage signal; and
 coupling the linear voltage signal in series with the second end of the capacitor.

15. The method of claim 14 wherein the active device is a MOSFET device, the control voltage is the gate to source voltage, the first current is the drain current, and the relationship of the drain current is a non-linear function with respect to the gate to source voltage.

16. The method of claim 14 wherein the active device is a bipolar transistor, the control node is the base, the second node is the emitter and the third node is the collector.

17. The circuit of claim 14 wherein the linear device is a resistor.

18. The method of claim 14 wherein the linear voltage signal is an amplified version of the voltage from the voltage control node and the second node of the active device.

19. The method of claim 18 wherein the amplified version provides a voltage gain that multiplies the effective value of the capacitor by the voltage gain.

20. A current mode circuit for creating a single real pole, the circuit comprising:
 a first terminal for accepting an input current; the first terminal having a first voltage signal
 a capacitor with one end coupled to the first terminal and a second end;
 an active circuit that accepts the first voltage signal at the first terminal and in response provides a first current;
 a current path from the first terminal to the active circuit, wherein the input current divides between the capacitor and the active circuit;
 a mirror circuit coupled to the active circuit that provides a second voltage signal; and
 a coupling of the second voltage signal in series with the second end of the capacitor.

* * * * *